US011656453B2

United States Patent
Kwan et al.

(10) Patent No.: US 11,656,453 B2
(45) Date of Patent: *May 23, 2023

(54) OPTICAL IMAGING ARRANGEMENT WITH A PIEZOELECTRIC DEVICE

(71) Applicant: Carl Zeiss SMT GmbH, Oberkochen (DE)

(72) Inventors: Yim-Bun Patrick Kwan, Oberkochen (DE); Axel Lorenz, Meissen (DE); Jasper Wesselingh, Moettingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/983,172

(22) Filed: Aug. 3, 2020

(65) Prior Publication Data

US 2020/0363628 A1 Nov. 19, 2020

Related U.S. Application Data

(63) Continuation of application No. 15/912,959, filed on Mar. 6, 2018, now Pat. No. 10,732,402, which is a
(Continued)

(30) Foreign Application Priority Data

Sep. 23, 2015 (DE) .................. 102015218229.0

(51) Int. Cl.
*G02B 26/08* (2006.01)
*G03F 7/20* (2006.01)
*G02B 27/00* (2006.01)

(52) U.S. Cl.
CPC ..... *G02B 26/0825* (2013.01); *G02B 27/0025* (2013.01); *G03F 7/20* (2013.01); *G03F 7/70266* (2013.01)

(58) Field of Classification Search
CPC ... G02B 26/0825; G02B 27/0025; G03F 7/20; G03F 7/70266
(Continued)

(56) References Cited

U.S. PATENT DOCUMENTS 4,128,309 A * 12/1978 Lehureau ........... G02B 26/0816
359/846
4,298,247 A * 11/1981 Michelet ........... G02B 26/0816
359/291

(Continued)

FOREIGN PATENT DOCUMENTS

CN 203705723 7/2014
DE 10 2004 051 838 A 5/2005
(Continued)

OTHER PUBLICATIONS

International Search Report and Written Opinion, for corresponding Appl No. PCT/EP2016/072595, dated Dec. 19, 2016.
(Continued)

*Primary Examiner* — Ricky D Shafer
(74) *Attorney, Agent, or Firm* — Fish & Richardson P.C.

(57) ABSTRACT

An optical imaging arrangement includes an optical element and a piezoelectric device. The optical element includes an optical element body carrying an optical surface on a front side of the optical element body. The piezoelectric device includes a first electrode and at least one piezoelectric element. The first electrode is configured to cooperate with the at least one piezoelectric element and at least one second electrode, when the at least one second electrode is located on a rear side of the optical element body and the at least one piezoelectric element is located between the first electrode and the at least one second electrode, the rear side of the optical element body being opposite to the front side of the optical element body. The first electrode is located on the front side of the optical element body, and the at least one
(Continued)

piezoelectric element is formed by at least one piezoelectric section of the optical element body.

28 Claims, 2 Drawing Sheets

Related U.S. Application Data continuation of application No. PCT/EP2016/072595, filed on Sep. 22, 2016.

(58) Field of Classification Search
USPC .................. 359/845, 846, 847, 849, 900
See application file for complete search history.

(56) References Cited

U.S. PATENT DOCUMENTS

| | | | |
|---|---|---|---|
| 4,420,222 A * | 12/1983 | Bret | G02B 26/0825 |
| | | | 359/846 |
| 4,655,563 A | 4/1987 | Plante et al. | |
| 5,986,795 A | 11/1999 | Chapman et al. | |
| 10,732,402 B2 | 8/2020 | Kwan et al. | |
| 2002/0041445 A1 * | 4/2002 | Nishioka | G02B 1/06 |
| | | | 359/627 |
| 2002/0048096 A1 | 4/2002 | Melzer et al. | |
| 2002/0101646 A1 | 8/2002 | Ide et al. | |
| 2004/0233553 A1 * | 11/2004 | Shibata | G11B 7/13927 |
| | | | 359/846 |
| 2006/0018045 A1 | 1/2006 | Moeller et al. | |
| 2008/0037146 A1 | 2/2008 | Griffith et al. | |
| 2011/0181852 A1 | 7/2011 | Bleidistel et al. | |
| 2011/0235012 A1 | 9/2011 | Fidcher et al. | |
| 2012/0075732 A1 * | 3/2012 | Griffith | G02B 23/06 |
| | | | 359/846 |
| 2015/0104745 A1 | 4/2015 | Huang et al. | |
| 2017/0017164 A1 * | 1/2017 | Kwan | G02B 26/0825 |
| 2018/0017862 A1 | 1/2018 | Ter Meulen et al. | |

FOREIGN PATENT DOCUMENTS

| | | |
|---|---|---|
| DE | 10 2011 081 603 A | 10/2012 |
| DE | 10 2011 077 234 A | 12/2012 |
| GB | 2046936 A | 11/1980 |
| JP | 2000105306 A | 4/2000 |
| JP | 2002-228813 A | 8/2002 |
| JP | 2004-001110 A | 1/2004 |
| JP | 2006012286 A | 1/2006 |
| JP | 2006138950 A | 6/2006 |
| JP | 2012-504323 A | 2/2012 |
| JP | 2012504329 A | 2/2012 |
| JP | 2015018095 A | 1/2015 |
| JP | 2018512263 A | 5/2018 |
| JP | 6612439 B2 | 11/2019 |
| WO | WO 2005/069055 A2 | 7/2005 |
| WO | WO2010037732 A2 | 4/2010 |
| WO | WO2016128493 A1 | 8/2016 |

OTHER PUBLICATIONS

International Preliminary Report on Patentability, for corresponding Appl No. PCT/EP2016/072595, dated Apr. 5, 2018.
Japanese Office Action, with translation thereof, for corresponding JP Appl No. 2018-512263, dated Mar. 19, 2019.
Japanese Office Action, with translation thereof, for corresponding JP Appl No. 2019-197403, dated Sep. 29, 2019.

* cited by examiner

OPTICAL IMAGING ARRANGEMENT WITH A PIEZOELECTRIC DEVICE

CROSS-REFERENCE TO RELATED APPLICATIONS

The present application is a continuation of, and claims benefit under 35 USC 120 to, U.S. application Ser. No. 15/912,959, filed Mar. 6, 2018, which is a continuation of, and claims benefit under 35 USC 120 to, international application PCT/EP2016/072595, filed Sep. 22, 2016, which claims benefit under 35 USC 119 of German Application No. 10 2015 218 229.0, filed Sep. 23, 2015. The entire disclosure of these applications are incorporated by reference herein.

FIELD

The disclosure relates to optical imaging arrangements used in exposure processes, in particular to optical imaging arrangements of microlithography systems. It further relates to methods of supporting components of a piezoelectric device of an optical imaging arrangement as well as methods of detecting or actively adjusting a state of an optical element of an optical imaging arrangement. The disclosure also relates to photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element units including optical elements, such as lenses and mirrors etc., arranged in the exposure light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually include an external generally ring shaped support device supporting one or more optical element holders each, in turn, holding an optical element.

Due to the ongoing miniaturization of semiconductor devices there is, however, a desire for enhanced resolution of the optical systems used for fabricating those semiconductor devices. This desire for enhanced resolution obviously pushes the desire for an increased numerical aperture (NA) and increased imaging accuracy of the optical system.

One approach to achieve enhanced resolution is to reduce the wavelength of the light used in the exposure process. In the recent years, approaches have been taken using light in the extreme ultraviolet (EUV) range, typically using wavelengths ranging from 5 nm to 20 nm, in most cases about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

The accuracy of the position of the image on the substrate is referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33.

Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict desired properties with respect to the relative position between the components participating in the exposure process as well as the deformation of the individual components. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the optical imaging arrangement components, i.e. the mask, the optical elements and the wafer, for example, cooperating in the exposure process are supported in a well-defined manner in order to maintain a predetermined spatial relationship between the optical imaging arrangement components and to provide minimum undesired deformation as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), as well as the under the influence of thermally induced position alterations, it is desirable to at least intermittently capture the spatial relationship between certain components of the optical imaging arrangement and to adjust the position of at least one of the components of the optical imaging arrangement as a function of the result of this capturing process. Similar applies to the deformation of at least some of these components of the optical imaging arrangement.

For example, deformable mirrors are known from US 2002/0048096 A1 (Melzer et al.) and U.S. Pat. No. 5,986,795 (Chapman et al.), the entire disclosure of each of which is incorporated herein by reference. Here, the deformable mirror arrangement is formed by a mirror body and a matrix of piezoelectric actuators arranged on the mirror rear side opposite to the optical surface of the mirror. The piezoelectric actuators typically act in a direction perpendicular to the optical surface between the mirror body and a counter structure (i.e. in push-pull configuration as shown e.g. in U.S. Pat. No. 5,986,795). As an alternative, in mirror intrinsic deformation systems, the piezoelectric actuators act exclusively on the mirror body introducing shear forces (typically parallel to the optical surface) to generate bending deformation of the mirror body (as shown e.g. in US 2002/0048096 A1). A similar configuration is also known from DE 10 2004 051 838 A1 (Möller et al.), the entire disclosure of which is incorporated herein by reference.

In these cases, attachment of the piezoelectric actuators to the mirror body is used for the long term imaging accuracy of the optical system. The most widely used attachment method in mirror intrinsic systems is gluing, which can take place at or near room temperature. However, the glue layer between the actuator and mirror body is subject to long term changes on a nanometer scale, e.g. due to stress relaxation, moisture absorption etc. This particularly applies under cyclic stress as it is typically the case in optical imaging systems.

In order to compensate for such long term changes, it is usually desirable to provide a sensor system capturing information representative of the deformation of the mirror and to provide a control system to take corrective actions. Such a sensor and control system adds greatly to the cost and complexity of the system. Moreover, in case of a failure of the sensor and control system, the deformation caused by dimensional changes of the adhesive layer can no longer be compensated for, i.e. the system cannot be operated further even when the deformation system is deactivated.

Other attachment methods, such as anodic bonding, frit bonding, thermosonic bonding, etc. all take place at elevated temperatures, typically around 200° C. This implies that in order to obtain a near stress-free assembly at room temperature, the mirror body and the piezoelectric actuators have to exhibit coefficients of thermal expansion (CTE), which closely match. This however poses certain issues, since there are very few glass materials and only a couple of specialized metallic materials, which are suitable for known mirror polishing processes and, at the same time, exhibit a coefficient of thermal expansion sufficiently closely matching the coefficient of thermal expansion of appropriate piezoelectric actuators.

A further issue involved with known intrinsic deformation systems are the parasitic stresses introduced into the mirror via the electrical connections to apply the electric field to each piezoelectric actuator. Multiple electrodes of the desired pattern are placed on the rear side of the mirror and are wired to their respective driving electronics to enable application of the electrical field. Most known wire attachment processes, such as soldering, ultrasonic bonding, gluing using conductive adhesives, etc. are not stress-free. This in turn causes deformation on the mirror surface (as the electrodes on the back side have to be placed directly under the optical footprint), which is further subject to drift and relaxation over lifetime.

This issue is common to all the aforementioned systems as well as to reflective systems with a deformation layer having front and rear electrodes forming part of a multilayer reflective optical surfaces as it is known for example from DE 10 2011 077 234 A1 (Dinger et al.), the entire disclosure of which is incorporated herein by reference. Similar applies to systems with a deformation layer having front and rear electrodes which are located between the optical element body and the reflective optical surface as it is known for example from DE 10 2011 081 603 A1 (Dinger et al.), the entire disclosure of which is incorporated herein by reference. Finally, this also applies to systems with a deformation sections having front and rear electrodes which are embedded in the optical element body as it is known for example from US 2015/0104745 A1 (Huang et al.), the entire disclosure of which is incorporated herein by reference.

SUMMARY

The disclosure seeks to, at least to some extent, overcome the above disadvantages and to provide good and long term reliable imaging properties of an optical imaging arrangement used in an exposure process.

The disclosure seeks to reduce the effort for an optical imaging arrangement while at least maintaining the imaging accuracy of the optical imaging arrangement used in an exposure process.

According to one aspect, the disclosure is based on the technical teaching that an overall reduction of the effort for an optical imaging arrangement while at least maintaining the imaging accuracy of the optical imaging arrangement may be achieved if the first electrode is located on the front side of the optical element body, and the at least one piezoelectric element is formed by at least one piezoelectric section of the optical element body itself.

Such a solution has the advantage that at least a part of the optical element body itself forms the piezoelectric element, such that disturbances introduced (immediately or over time) into the optical element as the result of any bonding process between the optical element body and the piezoelectric element are eliminated.

Furthermore, disturbances introduced (immediately or over time) into the optical element as a result of any bonding process between the first electrode and its connector to the associated electrical circuitry can be minimized. This is due to the fact that the first electrode may be used as a common counter electrode (e.g. a simple ground electrode connected to electrical ground) for a plurality (up to all) of the second electrodes located at the rear side of the optical element. As a result, the connector of the first electrode to the associated electrical circuitry can be placed external to the optical footprint of the optical surface (i.e. the part of the optical surface actually used in the respective imaging process). Hence, due to this distance between the connector to the optical footprint, any residual or parasitic stress resulting from this connector bonded to the first electrode may have already sufficiently relaxed before reaching the optical footprint.

Moreover, this configuration allows mechanically decoupling the second electrode(s) from the optical element body. More precisely, the second electrode(s) may be formed on a separate electrode carrier decoupled from the optical element body. Hence, while it is possible to arrange the second electrode(s) at the rear side of the optical element within a projection of the optical footprint of the optical surface (along the respective local surface normal of the optical surface), the mechanical decoupling of the second electrode (s) from the optical element body prevents the introduction of residual or parasitic stress originating from the second electrode(s) into the area of the optical footprint of the optical element.

Hence, in a very simple and cost efficient manner, the risk of long term degradation of the optical performance of the optical imaging arrangement resulting from residual or parasitic stress caused by the electrodes of the piezoelectric device and propagating into the optical surface (in particular, into the area of the optical footprint) of the optical element can be greatly reduced.

Thus, according to a first aspect of the disclosure there is provided an optical imaging arrangement including an optical element and a piezoelectric device. The optical element includes an optical element body carrying an optical surface on a front side of the optical element body. The piezoelectric device includes a first electrode and at least one piezoelectric element. The first electrode is configured to cooperate with the at least one piezoelectric element and at least one second electrode, when the at least one second electrode is located on a rear side of the optical element body and the at least one piezoelectric element is located between the first electrode and the at least one second electrode, the rear side of the optical element body being opposite to the front side of the optical element body. The first electrode is located on the front side of the optical element body, and the at least one piezoelectric element is formed by at least one piezoelectric section of the optical element body. Preferably, the at least one second electrode is located on an electrode carrier unit separate from the optical element body.

It will be appreciated that the first electrode may be placed at any suitable and desired location at the front side of the optical element body. In particular, provided that it has suitable optical properties (at the wavelength used in the optical imaging process to be performed using the optical element), it may even be located at the side of the optical surface facing away from the optical element body. With particularly simple variants, the first electrode is located between the optical surface and the at least one piezoelectric section. To this end, a part of the optical element body may be configured to form the first electrode (e.g. by an electrode section suitably doted to provide sufficient electrical conductivity).

In addition or as an alternative, the first electrode may be located between the optical surface and the optical element body. With these particularly simple to manufacture variants, the first electrode may be a simple layer formed (e.g. in a suitable deposition process of an electrically conductive material) on the optical element body.

In addition or as an alternative, with particularly simple to manufacture variants, the first electrode may be formed by at least one layer of electrically conductive material formed on the optical element body and/or on the at least one piezoelectric section.

It will be appreciated that the optical surface may be configured in any desired way suitable for the wavelength used in the optical imaging process to be performed using the optical element. With particularly simple variants, the optical surface is formed by at least one reflective layer formed on the first electrode. Here, conventional optical surface may be used in an advantageous manner.

With particularly beneficial variants, at least a part of the optical surface is formed by a surface of the first electrode. This functional integration greatly reduces the overall effort for the system.

It will be appreciated that the at least one piezoelectric section may extend only over a part of the optical element body, which has to be covered by the effects of the piezoelectric device. This may be achieved e.g. by suitable material doting of certain parts of the optical element body or by (essentially residual stress free and long term stable) bonding of separate parts to form the optical element body. With this approach, eventually, a plurality of separate piezoelectric sections may be formed.

Preferably, the at least one piezoelectric section substantially extends from the first electrode to a rear surface of the optical element body confining the optical element body at the rear side of the optical element body. This yields particularly simple configurations.

With certain variants, the optical surface defines an optically usable area (also referred to as an optical footprint) of the optical element, which is usable in the optical imaging process to be performed with the optical element, and the at least one piezoelectric section extends over at least the optically usable area. Hence, at least this optically usable area may be covered by the effects to be achieved with the piezoelectric device. The optical imaging process may be any optical imaging process at any desired wavelength. In particular, it may be a microlithography process, in particular, using light in an EUV range or in a so called Vacuum Ultraviolet (VUV) range (typically from 100 nm to 200 nm, e.g. at 193 nm).

With preferred embodiments yielding particularly good imaging properties, the at least one piezoelectric section forms at least 80%, preferably at least 90%, more preferably 100%, of the optical element body. Preferably, the entire optical element body is formed by a piezoelectric material to provide the at least one piezoelectric section. In particularly robust and simple to manufacture variants, the optical element body is a monolithic body made from a piezoelectric material.

It will be appreciated that the optical element body may have any desired and suitable shape. Preferably, the optical surface defines an optically usable area of the optical element usable in an optical imaging process (as outlined above) and, over at least the optically usable area, a dimension of the optical element body along a local surface normal of the optical surface is substantially uniform. This has the advantage that the electrical field generated between the first and a second electrode may be kept uniform.

It will be appreciated however that, with other embodiments, this dimension of the optical element body along the respective local surface normal of the optical surface may also be varied.

It will be appreciated that any desired any suitable material may be used for the at least one piezoelectric section. Preferably, the at least one piezoelectric section is made from a material having a piezoelectric coefficient that is N times a piezoelectric coefficient of a quartz ($SiO_2$) material, wherein N is at least 2, preferably at least 3 to 8, more preferably at least 10. If deformation is to be effected using the piezoelectric device, this yields sufficiently large deformation of the optical element at suitably low and readily manageable electrical fields or voltages, respectively.

Preferably, the at least one piezoelectric section is made from a material having a piezoelectric coefficient that is at least 10 pm/V, preferably at least 20 pm/V, more preferably ranges from 30 pm/V to 100 pm/V, even more preferably ranges from 30 pm/V to 70 pm/V. This yields particularly good results in terms of the ratio of the voltage for a desired deformation.

With preferred variants, the at least one piezoelectric section is made from a glass like piezoelectric material. This has the advantage that the piezoelectric section is suitable for use in a conventional optical surface manufacturing process, such that the optical surface may be formed on the piezoelectric section. This greatly reduces the effort for the manufacture of the optical element.

Similarly, preferably, the at least one piezoelectric section is made from a piezoelectric material suitable for undergoing at least one optical surface manufacturing process to produce an optical grade surface of the optical element body, in particular to produce an optical grade surface suitable for use in a microlithography process, in particular at a wavelength in an EUV range or in a VUV range.

With certain embodiments, monopolar piezoelectric materials may be used. Preferably, the at least one piezoelectric section is made from a bipolar piezoelectric material contracting in reaction to a first electric field of a first polarity and expanding in reaction to a second electric field of a second polarity, the second polarity being inverse to the first polarity. Such a solution has the advantage that the achievable deformation (at a certain voltage) is considerably increased in a beneficial way.

Preferably, the at least one piezoelectric section is made from a material selected from a material group consisting of lithium niobate ($LiNbO_3$), diphenylalanine peptide nanotubes (PNTs), quartz ($SiO_2$), gallium phosphate ($GaPO_4$), hemimorphic tourmaline, lanthanum gallium silicate ($La_3Ga_2SiO_{14}$, also referred to as langasite), calcium gallogermanate ($Ca_3Ga_2Ge_4O_{14}$) and combinations thereof. All these materials provide at least some of the beneficial properties outlined above. Especially lithium niobate ($LiNbO_3$) provides all the beneficial properties outlined above. It is a glass like, bipolar piezoelectric material having a piezoelectric coefficient in the range from 30 pm/V to 70 pm/V, typically about 40 pm/V. It can undergo optical surface manufacturing processes, such as polishing, yielding a surface accuracy suitable for optical imaging processes down to the EUV range.

It will be appreciated that, basically, any desired and suitable arrangement of the piezoelectric material may be selected. More precisely, while, for materials with an isotropic behavior regarding the response to an electrical field, orientation of the piezoelectric material is essentially irrelevant, materials with anisotropic response to an electrical field may have a preferred specific alignment of the material, for example with respect to the respective local surface normal of the optical surface. Such materials with an anisotropic response to an electrical field, typically, have at least one direction of maximum response to a given electric field. In the example of the lithium niobate ($LiNbO_3$) material as outlined above, this direction of maximum response is typically referred to as the Y36°-cut direction.

In many cases, it may be preferred to have this direction of maximum response (at any point of the piezoelectric section) in a specific orientation with respect to a reference direction of the optical element, for example, with respect to a local surface normal of an optical surface of the optical element. In many cases, it may be preferred to have this direction of maximum response as perfectly aligned with the local surface normal of the optical surface as possible. With further embodiments, orientation of the direction of maximum response may be used to create a specific deformation behavior of the piezoelectric section. Hence, orientation of the direction of maximum response of the piezoelectric section may be selected as a function of the deformation of the piezoelectric section to be achieved in response to a given electric field.

Hence, with certain embodiments, the at least one piezoelectric section is made from an anisotropic piezoelectric material having a direction of maximum response to an electrical field. Here, the material of the at least one piezoelectric section is arranged such that an inclination between the direction of maximum response and a local surface normal of the optical surface is less than 20°, preferably less than 10°, more preferably 0° to 5°. With this approach, particularly efficient use may be made of the piezoelectric material.

It will be appreciated that, with certain embodiments, the at least one second electrode may be connected to the rear side of the optical element body. As outlined above, however, preferably, the piezoelectric device includes an electrode carrier unit, which is located adjacent to an optical element body rear surface confining the optical element body at the rear side. This electrode carrier unit carries the at least one second electrode. Such a solution has the advantage that, with a proper mechanical decoupling between the optical element body and the electrode carrier unit, any residual or parasitic stress resulting from the electrical connection of the at least one second electrode is introduced into the electrode carrier unit (not participating in the imaging process) rather than into the optical element body. This is highly beneficial in terms of the overall imaging quality of the optical imaging arrangement.

Mechanical decoupling between the optical element body and the electrode carrier unit may be achieved in any suitable way. For example, a stress relaxation layer may be interposed between the optical element body and the electrode carrier unit carrying the at least one second electrode.

Preferably, at least in a neutral state of the optical imaging arrangement, a gap is formed between the electrode carrier unit and the optical element body rear surface, such that, at least in a vicinity of the at least one second electrode, the optical element body rear surface does not contact the electrode carrier unit and the at least one second electrode. Hence, despite arranging the at least one second electrode within the projection of the optical footprint of the optical element (along the respective local surface normal of the optical surface), the part of the optical element body lying in this projection may be kept free of contact between the optical element body and the electrode carrier unit. Hence, the introduction of parasitic or residual stress into this sensitive area may be beneficially avoided.

The gap may have any suitable dimension, which reliably prevents contact between the optical element body and the electrode carrier unit under any normal operating conditions of the optical imaging arrangement, while at the same time keeping the weakening of the electrical field across the gap at an acceptable minimum (for example, to keep the electrical power consumption for a given deformation of the optical element as low as possible).

Typically, the gap, at any location of the optical element body rear surface in the vicinity of the at least one second electrode, may define a local gap width along a local surface normal of the optical element body rear surface. Preferably, the local gap width, at least in the neutral state, in the vicinity of the at least one second electrode, is at least 1 μm, preferably at least 5 μm, more preferably at least 10 μm. This typically reliably prevents contact between the optical element body and the electrode carrier unit under any normal operating conditions of the optical imaging arrangement.

Moreover, preferably, the local gap width, at least in the neutral state, in the vicinity of the at least one second electrode, in particular, is at most 100 μm, preferably at most 50 μm, more preferably at most 20 μm. This typically keeps the weakening of the electrical field across the gap at an acceptable value.

Particularly beneficial results are achieved at a gap width between 5 μm and 20 μm, typically at a gap width of 10 μm, since it provides a good compromise between the losses in the electric field across the gap and ease of manufacture and assembly.

The gap itself may have any desired and suitable shape. In particular, the shape of the gap and the resulting dielectric properties of the gap may be used to tune the performance of the piezoelectric device, more precisely, the volumetric shape of the electrical fields generated between the first and second electrodes to a certain desired volumetric behavior, e.g. as a function of a specific deformation of the optical element to be achieved.

With certain embodiments, a shape of the electrode carrier unit is adapted to a shape of the optical element body rear surface, such that the local gap width, at least in the neutral state, in the vicinity of the at least one second electrode, is at least substantially uniform. In these cases, the electrical field between the first and a second electrode can be kept uniform. Such a solution may be particularly preferred where the distance between the first electrode and the optical element body rear surface is also substantially uniform. In this case, it may be easily achieved that the piezoelectric device exhibits the same response to a given voltage or electrical field, respectively, over its entire (useful) area and the optical footprint, respectively.

With preferred embodiments of the disclosure, the gap, at least temporarily during normal operation of the optical imaging arrangement, is filled with a fluid. This allows tuning the properties of the gap to a specific desired behavior.

With certain embodiments, for example, the piezoelectric device is configured to apply, during normal operation of the optical imaging arrangement, a maximum voltage between the first electrode and the at a least one second electrode, and the fluid has a fluid dielectric constant sufficient to prevent arcing of the gap upon appliance of the maximum voltage between the first electrode and the at a least one second electrode. This ensures proper operation of the piezoelectric device under any normal operating condition. It will be appreciated that this fluid dielectric constant or the dielectric strength of the fluid sufficient to prevent arcing of the gap upon appliance of the maximum voltage, in a first approximation, is a simple function of the maximum voltage and the minimum width of the gap (i.e. the arcing distance).

It will be appreciated that any desired and suitable fluid may be used. With certain embodiments, the fluid includes at least one gas of a gas group consisting of dry air, dry nitrogen ($N_2$), and sulfur hexafluoride ($SF_6$). As an alternative the fluid may also include at least one liquid of a liquid group consisting of perfluoropolyether (PFPE), glycerin, glycerol ($C_3H_8O_3$), and deionized water ($H_2O$). Such a fluid, in particular, a liquid has the additional advantage that it may provide a damping functionality damping vibrations introduced into the optical element and, hence, improving the vibrational behavior of the optical element. Furthermore, the fluid may act in a beneficial way as a heat carrier providing improved heat removal from the optical element body to the mechanically decoupled electrode carrier, which may then, for example, be part of a temperature control device of the optical imaging arrangement.

The fluid may also be used as a parameter in tuning the dielectric properties of the gap in the manner as it has been outlined above. Preferably, the fluid has a fluid dielectric constant and the piezoelectric section has a piezoelectric section dielectric constant, the fluid dielectric constant deviating from the piezoelectric section dielectric constant by at most 30%, preferably by at most 5% to 20%, more preferably by at most 1% to 10%, of the piezoelectric section dielectric constant. This yields particularly simple configurations. However, if desired for certain reasons, the fluid dielectric constant may also range from 0.1 times the piezoelectric section dielectric constant to 10 times the piezoelectric section dielectric constant.

It will be appreciated that glycerin is particularly suitable, since it shows all the beneficial properties as outlined above. In addition, it has a low vapor pressure, which is particularly beneficial in cases where contamination of the optical elements of an optical imaging arrangement is an issue.

Preferably, the piezoelectric device includes a sealing device, the sealing device acting between the electrode carrier unit and the optical element body and sealing the gap from a surrounding atmosphere. This is particularly beneficial in applications where the optical imaging arrangement is sensitive to contamination by the fluid. Preferably, the sealing device includes a labyrinth seal arrangement, which maintains mechanical decoupling between the electrode carrier unit and the optical element body in a beneficial way.

The fluid may be introduced into the gap at any desired time before use of the optical imaging arrangement. It may eventually only be exchanged during maintenance of the optical imaging arrangement. With certain embodiments, the piezoelectric device includes a purging device configured to purge the gap with a purging fluid. This purging device may then, for example, also be part of a temperature control device of the optical imaging arrangement.

The electrode carrier unit may be made of any suitable and long term dimensionally stable (at the desired accuracy, typically at micrometer level) material providing proper support and, preferably, electrical separation of the supported second electrode(s). Preferably, the electrode carrier unit is made of a carrier unit material including an electric insulator material, which yields particularly simple configurations.

With certain embodiments, the electrode carrier unit is made of a carrier unit material of a carrier unit material group consisting of a ceramic material, aluminum oxide ($Al_2O_3$), aluminum nitride (AlN), zirconium oxide ($ZrO_2$) and glass porcelain. Such materials typically provide at least some of the beneficial properties as outlined above. This particularly applies to aluminum oxide ($Al_2O_3$) providing all these beneficial properties at comparatively low expense.

The at least one second electrode may be formed on the electrode carrier unit in any desired and suitable way. Preferably, the at least one second electrode is made from at least one layer of electrically conductive material deposited on the electrode carrier unit. In addition or as an alternative, the at least one second electrode is formed in a printed circuit board manufacturing process. This yields particularly simple and inexpensive configurations.

It will be appreciated that mechanical decoupling may be achieved in any suitable way. Preferably, the optical element body is supported on a support structure via an optical element body support unit and the electrode carrier unit is supported on the support structure via an electrode carrier support unit in such a manner that at least a vicinity of the at least one second electrode is mechanically decoupled from the optical element body.

With certain embodiments, the optical element body support unit is separate from the electrode carrier support unit to achieve mechanical decoupling. Here, for example, the optical element body and the electrode carrier unit may be supported in a kinematically parallel manner.

As an alternative, in a kinematically serial support arrangement, the optical element body support unit contacts the optical element body at at least one optical element body support location and the electrode carrier support unit contacts the optical element body in a vicinity of the at least one optical element body support location. Such a cascaded support with an introduction of the support forces for the electrode carrier unit into the optical element body at a location close to the introduction of the support forces for the optical element body minimizes the path length of the support forces for the electrode carrier unit flowing through the optical element body and, hence, the corresponding resulting disturbance introduced into the optical element body.

In an alternative kinematically serial support arrangement with inverted seriality, the electrode carrier support unit contacts the optical element body at at least one electrode carrier support location and the optical element body support unit contacts the electrode carrier unit in a vicinity of the at least one electrode carrier support location. This yields similar advantages to the ones outlined above in the context of the other kinematically serial support arrangement.

It will be appreciated that the present concept, not least due to the elimination of long term variations of the interaction between the piezoelectric device and the optical element, where desired, allows implementation of an open loop control of the piezoelectric device. With other embodiments, however, a closed loop control may be implemented as well. It will be appreciated that the piezoelectric device may be used as a deformation device introducing a certain desired deformation into the optical element. In addition or as an alternative, the piezoelectric device may also be used as a sensor device.

With certain variants, the piezoelectric device includes a sensor device configured to provide sensor information to a control device, the sensor information being representative of a deformation and/or an orientation and/or a position of the optical element body and/or a vibrational disturbance acting on the optical element body in at least one degree of freedom up to all six degrees of freedom in space.

The sensor device may generally work according to any desired working principle providing the desired information. Preferably, the sensor device includes at least one third electrode electrically insulated from the at least one second electrode and located in a vicinity of the at least one second electrode. In other words, in these cases, the sensor device also works according to a piezoelectric working principle. The third electrode may be arranged in any desired and suitable way as a function of the sensor information to be obtained. Preferably, the third electrode is surrounded by the second electrode and/or located at an area center of gravity of the second electrode. This allows functionally associating the third electrode to a specific second electrode, which is beneficial, in particular, with respect to the accuracy of a closed loop control. Typically, the third electrode is much smaller than the associated second electrode. A surface of the third electrode is typically 1% to 20%, preferably 2% to 15%, more preferably 2% to 10%, of the surface of the second electrode.

Preferably, the piezoelectric device includes the control device, which is configured to apply a voltage between the first electrode and the at least one second electrode as a function of the sensor information. This closed loop control may be used for any desired purpose. In particular it may be used to influence a vibrational behavior of the optical element body, in particular, to increase a resonant frequency of the optical element body.

It will be appreciated that the optical imaging arrangement may be used in the context of any desired optical imaging process at any desired imaging wavelength. Particularly good results may be achieved in the context of optical imaging arrangements configured to be used in microlithography using exposure light at an exposure light wavelength in a UV range, in particular, an EUV range. Hence, preferably, the exposure light has an exposure light wavelength ranging from 5 nm to 20 nm.

Preferably, the optical imaging arrangement includes an illumination unit, a mask unit, an optical projection unit and a substrate unit. The illumination unit is configured to illuminate a mask received by the mask unit with the exposure light. The optical projection unit is configured to transfer an image of a pattern formed on the mask onto a substrate received by the substrate unit. The optical element then may form part of either of the illumination unit and the optical projection unit.

According to a second aspect of the disclosure there is provided a method of supporting a first electrode, at least one second electrode and at least one piezoelectric element of a piezoelectric device of an optical imaging arrangement, which includes an optical element with an optical element body carrying an optical surface on a front side of the optical element body. The method includes locating the at least one second electrode on a rear side of the optical element body, the rear side of the optical element body being opposite to the front side of the optical element body. The method further includes locating the at least one piezoelectric element between the first electrode and the at least one second electrode. The method further includes locating the first electrode on the front side of the optical element body, and forming the at least one piezoelectric element by at least one piezoelectric section of the optical element body. Preferably, the at least one second electrode is located on an electrode carrier unit separate from the optical element body. With this method, the variants and advantages as outlined above in the context of the optical imaging arrangement according to the present disclosure may be achieved to the same extent, such that insofar explicit reference is made to the statements made in the foregoing.

It will be appreciated that, as outlined above, the piezoelectric device may be used as a sensor device. Hence, according to a third aspect, the present disclosure relates to a method of capturing information representative of a deformation and/or an orientation and/or a position of the optical element body of the optical imaging arrangement according to the disclosure in at least one degree of freedom up to all six degrees of freedom in space using the piezoelectric device. With this method, the variants and advantages as outlined above in the context of the optical imaging arrangement according to the present disclosure may be achieved to the same extent, such that insofar explicit reference is made to the statements made in the foregoing.

It will be further appreciated that, as outlined above, in addition or as an alternative, the piezoelectric device may be used as a deformation device introducing a certain desired deformation into the optical element. Hence, according to a fourth aspect, the present disclosure relates to a method of actively adjusting a deformation and/or an orientation and/or a position of the optical element body of the optical imaging arrangement according to the present disclosure in at least one degree of freedom up to all six degrees of freedom in space using the piezoelectric device. With this method, the variants and advantages as outlined above in the context of the optical imaging arrangement according to the present disclosure may be achieved to the same extent, such that insofar explicit reference is made to the statements made in the foregoing.

Finally, according to a fifth aspect, the present disclosure relates to an optical imaging method, wherein, in an exposure process using exposure light, an image of a pattern is transferred, onto a substrate using the optical imaging arrangement according to the present disclosure. With this method as well, the variants and advantages as outlined above in the context of the optical imaging arrangement according to the present disclosure may be achieved to the same extent, such that insofar explicit reference is made to the statements made in the foregoing.

During the exposure process information representative of a deformation and/or an orientation and/or a position of the optical element body of the optical imaging arrangement may be captured in at least one degree of freedom up to all six degrees of freedom in space using a method of capturing such information according to the present disclosure.

In addition or as an alternative, during the exposure process, a deformation and/or an orientation and/or a position of the optical element body of the optical imaging arrangement is actively adjusted in at least one degree of freedom up to all six degrees of freedom in space using a method of generating such motion according to the present disclosure.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION

In the following, preferred embodiments of an optical imaging arrangement 101 according to the disclosure with which preferred embodiments of methods according to the disclosure may be executed will be described with reference to FIGS. 1 to 4. To facilitate understanding of the following explanations a xyz coordinate system is introduced in the Figures, wherein the z-direction designates the vertical direction (i.e. the direction of gravity).

Figure 1:
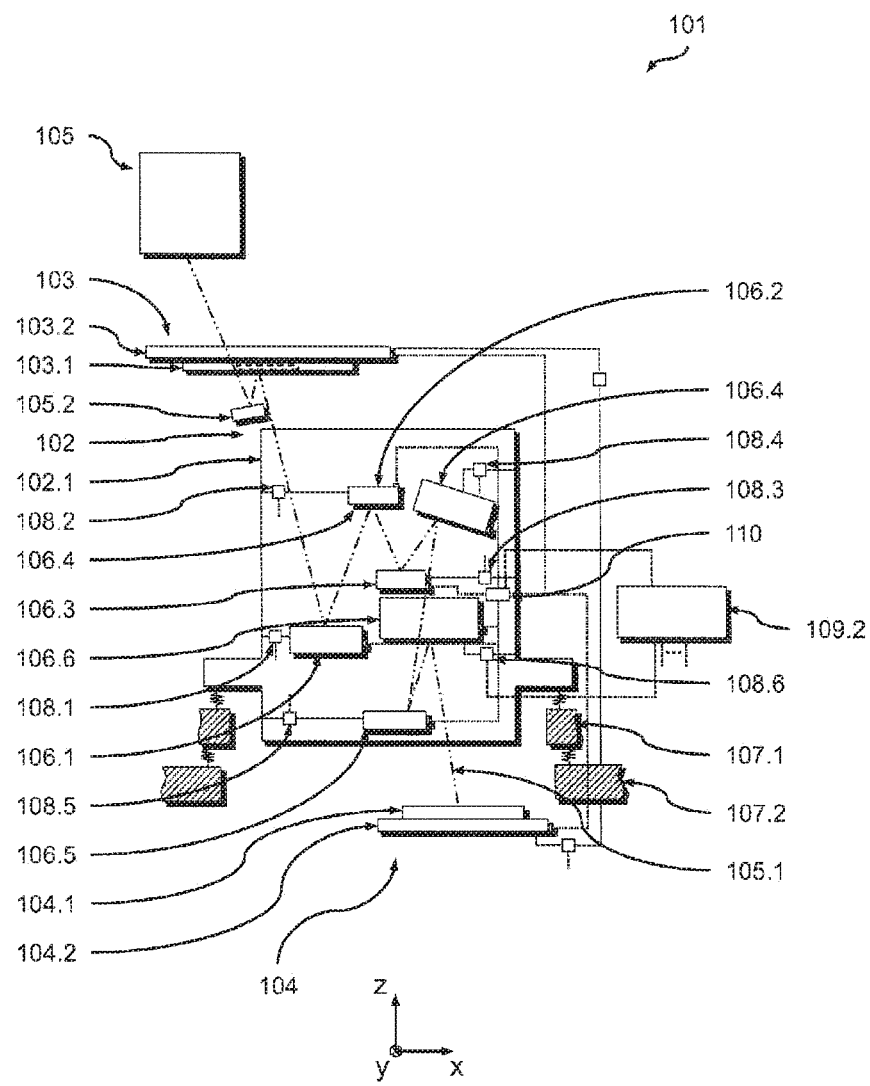
FIG. 1 is a schematic representation of a preferred embodiment of an optical imaging arrangement according to the disclosure with which preferred embodiments of methods according to the disclosure may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 includes an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 with exposure light (represented by its chief ray 105.1) via an appropriate light guide system 105.2. The optical projection unit 102 receives the light reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not have to form a complete or even (light and/or fluid) tight enclosure of the optical element unit group 106. Rather it may also be partially formed as an open structure as it is the case with the present example.

It will be appreciated that, in the sense of the present disclosure, an optical element unit may merely consist of an optical element, such as a mirror. However, such an optical element unit may also include further components such as a holder holding such an optical element.

The projection optics box structure 102.1 is supported in a vibration isolated manner on a load bearing structure 107.1, which in turn, is supported on a ground or base structure 107.2. The load bearing structure 107.1 is supported on the ground or base structure 107.2 in a vibration isolated manner at a vibration isolation resonant frequency that ranges from 0.05 Hz to 8.0 Hz, preferably from 0.1 Hz to 1.0 Hz, more preferably from 0.2 Hz to 0.6 Hz. Furthermore, typically, a damping ratio is selected that ranges from 5% to 60%, preferably from 10% to 30%, more preferably from 20% to 25%. In the present example a vibration isolation resonant frequency of 0.25 Hz to 2 Hz at a damping ratio of 15% to 35% is selected for the vibration isolated support of the load bearing structure 107.

The ground or base structure 107.2 (in a vibration isolated manner) also supports the mask table 103.2 via a mask table support device 103.3 and the substrate table 104.2 via a substrate table support device 104.3. It will be appreciated however that, with other embodiments of the disclosure, the load bearing structure 107.1 may also support (preferably in a vibration isolated manner) the mask table 103.2 and the substrate table 104.2.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 includes a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 includes an optical element in the form of a mirror, also referred to as mirrors M1 to M6 in the following.

It will be further appreciated that, with other embodiments of the disclosure, another number of optical element units may be used. Preferably, four to eight optical element units are provided.

Each one of the mirrors 106.1 (M1) to 106.6 (M6) is supported on the support structure formed by the projection optics box structure 102.1 by an associated support device 108.1 to 108.6. Each one of the support devices 108.1 to 108.6 is formed as an active device such that each of the mirrors 106.1 to 106.6 is actively supported at a defined control bandwidth. It will be further appreciated that, with other embodiments of the disclosure, only a part of the mirrors 106.1 (M1) to 106.6 (M6) may be actively supported.

In the present embodiment, the optical element 106.3 (mirror M3) is an actively deformable optical element using a piezoelectric device 109 as will be explained in greater detail the following. To this end, mirror 106.3 includes an optical element body 109.1 made of a piezoelectric material, which forms a piezoelectric section forming part of the piezoelectric device 109. Hence, the optical element body 109.1 forms a piezoelectric element, which is actuated by a control unit 109.2 of the piezoelectric device 109.

The piezoelectric device further includes a first electrode 109.3 and a plurality of second electrodes 109.4, each being separately electrically connected to the control unit 109.2. The first electrode 109.3 is formed by a layer of an electrically conductive material located on the front side 109.5 of the optical element body 109.1, while the second electrodes 109.4 are located on the rear side 109.6 of the optical element body 109.1. The first electrode 109.3 is configured to cooperate with the second electrodes 109.5 and the piezoelectric element 109.1 located between the first electrode 109.3 and the second electrodes 109.4 to provide defined deformation of mirror 106.3 under the control of control unit 109.2 as will be explained in greater detail below.

The optical element body 109.1 carries a reflective optical surface 110 formed on a front side of the optical element body 109.1, more precisely on a front surface 109.7 of the first electrode 109.3 (located between the optical surface 110 and the optical element body 109.1). The reflective optical surface 110 may include one or more optically active layers formed in a conventional reflective surface forming process (to provide reflectivity at the wavelength of 13 nm used in the optical imaging process to be performed using the optical element 106.3). Moreover, the front surface 109.7 may also form part of the reflective system of the reflective optical surface 110.

This configuration has the advantage that the optical element body 109.1 itself forms the piezoelectric element, such that disturbances introduced (immediately or over time) into the optical element 106.3 as the result of any bonding process between the optical element body and the piezoelectric element 109.1 are eliminated.

Furthermore, disturbances introduced (immediately or over time) into the optical element 106.3 as a result of any bonding process between the first electrode 109.3 and its connector 109.8 to the associated electrical circuitry, i.e. to control unit 109.2, can be minimized. This is due to the fact that the first electrode 109.3 is used as a common counter electrode (e.g. a simple ground electrode connected to electrical ground) for the second electrodes 109.4 located at the rear side of the optical element 106.3.

As a result, the connector 109.8 of the first electrode 109.3 to the control unit 109.2 can be placed external to the optical footprint of the optical surface 110 (i.e. the part of the optical surface 110 actually used in the imaging process performed with the optical imaging apparatus 101). Hence, due to this distance between the connector 109.8 to the optical footprint, any residual or parasitic stress resulting from this connector 109.8 bonded to the first electrode 109.3 may have already sufficiently relaxed before reaching the optical footprint.

Moreover, this configuration allows mechanically decoupling the second electrodes 109.4 from the optical element body 109.1. To this end, in the present example, the second electrodes 109.4 are formed on a separate electrode carrier 111 mechanically decoupled from the optical element body 109.1. Hence, while it is possible to arrange the second electrodes at the rear side 109.6 of the optical element 106.3 within a projection of the optical footprint of the optical surface (along the respective local surface normal of the optical surface 110), the mechanical decoupling of the second electrodes 109.4 from the optical element body 109.1 prevents the introduction of residual or parasitic stress originating from the second electrodes 109.4 or their electrical connection to control unit 109.2 into the area of the optical footprint of the optical element 106.3.

Hence, in a very simple and cost efficient manner, the risk of long term degradation of the optical performance of the optical imaging arrangement 101 resulting from residual or parasitic stress caused by the electrodes 109.3, 109.4 of the piezoelectric device 109 and propagating into the optical surface 110 (in particular, into the area of the optical footprint) of the optical element 106.3 can be greatly reduced.

It will be appreciated that, with other embodiments the piezoelectric section of the piezoelectric device 109 may extend only over a part of the optical element body 109.1, which has to be covered by the effects of the piezoelectric device 109. This may be achieved e.g. by suitable material doting of certain parts of the optical element body 109.1 or by (essentially residual stress free and long term stable) bonding of separate parts to form the optical element body 109.1. With this approach, eventually, a plurality of separate piezoelectric sections may be formed.

In the present example, since the entire optical element body 109.1 is a monolithic body made from piezoelectric material, the piezoelectric section extends from the first electrode 109.3 to a rear surface 109.9 of the optical element body 109.1 confining the optical element body 109.1 at the rear side of the optical element body 109.1. Moreover, the optical element body 109.1 (i.e. the piezoelectric section) extends over the optically usable area or optical footprint of the optical surface 110. Hence, the optically usable area is covered by the effects to be achieved with the piezoelectric device 109.

In the present example, the thickness of the optical element body 109.1, i.e. the dimension of the optical element body 109.1 along a local surface normal of the optical surface 110 is substantially uniform over the optically usable area of the optical surface 110, This has the advantage that the electrical field generated between the first electrode 109.3 and a second electrode 109.4 may be kept uniform.

It will be appreciated however that, with other embodiments, this dimension of the optical element body 109.1 along the respective local surface normal of the optical surface 110 may also be varied.

It will be appreciated that any desired any suitable material may be used for the at least one piezoelectric optical element body 109.1 (i.e. the piezoelectric section). Preferably, the optical element body 109.1 is made from a material having a piezoelectric coefficient that is N times a piezoelectric coefficient of a quartz ($SiO_2$) material, wherein N is at least 2, preferably at least 3 to 8, more preferably at least 10. If deformation is to be effected using the piezoelectric device 109, this yields sufficiently large deformation of the optical element 106.3 at suitably low and readily manageable electrical fields or voltages, respectively, generated under the control of the control unit 109.2 between the first electrode 109.3 and a second electrode 109.4.

Moreover, the piezoelectric section formed by the optical element body 109.1 is preferably made from a material having a piezoelectric coefficient that is at least 10 pm/V, preferably at least 20 pm/V, more preferably ranges from 30 pm/V to 100 pm/V, even more preferably ranges from 30 pm/V to 70 pm/V. This yields particularly good results in terms of the ratio of the voltage for a desired deformation.

Preferably, the piezoelectric section formed by the optical element body 109.1 is made from a glass like piezoelectric material. This has the advantage that the piezoelectric section is suitable for use in a conventional optical surface manufacturing process, such that the optical surface may be formed by the layers 109.3, 110 deposited on the piezoelectric optical element body 109.1. This greatly reduces the effort for the manufacture of the optical element 106.3.

Hence, preferably, the piezoelectric section formed by the optical element body 109.1 is made from a piezoelectric material suitable for undergoing at least one optical surface manufacturing process to produce an optical grade surface of the optical element body 109.1 suitable for use in the microlithography process at the wavelength of 13 nm (i.e. in the EUV range).

Moreover, the piezoelectric section formed by the optical element body 109.1 is preferably made from a bipolar piezoelectric material contracting in reaction to a first electric field EF1 of a first polarity P1 and expanding in reaction to a second electric field EF2 of a second polarity P2, the second polarity P2 being inverse to the first polarity P1. Such a solution has the advantage that the achievable deformation (at a certain voltage) of the optical element body 109.1 is considerably increased in a beneficial way.

Preferably, the at least one piezoelectric section formed by the optical element body 109.1 is made from a material selected from a material group consisting of lithium niobate (LiNbO$_3$), diphenylalanine peptide nanotubes (PNTs) and quartz (SiO2), gallium phosphate (GaPO$_4$), hemimorphic tourmaline, lanthanum gallium silicate (La$_3$Ga$_5$SiO$_{14}$, also referred to as langasite), and calcium gallo-germanate (Ca$_3$Ga$_2$Ge$_4$O$_{14}$) and combinations thereof. All these materials provide at least some of the beneficial properties outlined above.

In the present example, lithium niobate (LiNbO$_3$) is used as the material for the optical element body 109.1, since it provides all the beneficial properties outlined above. It is a glass like, bipolar piezoelectric material having a piezoelectric coefficient in the range from 30 pm/V to 70 pm/V, typically about 40 pm/V. It can undergo optical surface manufacturing processes, such as polishing, yielding a surface accuracy suitable for optical imaging processes in the EUV range.

As outlined above, the electrode carrier unit 111 is located adjacent to the optical element body rear surface 109.9 confining the optical element body 109.1 at the rear side 109.6. The electrode carrier unit carries 111 the second electrodes 109.4. Such a solution has the advantage that, with a proper mechanical decoupling between the optical element body 109.1 and the electrode carrier unit 111, any residual or parasitic stress originating from the electrical connection of the second electrodes 109.4 is introduced into the electrode carrier unit 111 (not participating in the imaging process) rather than into the optical element body 109.1. This is highly beneficial in terms of the overall imaging quality of the optical imaging arrangement 101.

To achieve mechanical decoupling between the optical element body 109.1 and the electrode carrier unit 111, in the present example, at least in a neutral state of the optical imaging arrangement 101, a gap 112 is formed between the electrode carrier unit 111 and the optical element body rear surface 109.9, such that, at least in a vicinity of the second electrodes 109.4, the optical element body rear surface 109.9 does not contact either of the electrode carrier unit 111 and the second electrodes 109.4.

Hence, despite arranging the second electrodes within the projection of the optical footprint of the optical element 106.3 (along the respective local surface normal of the optical surface 110), the part of the optical element body 109.1 lying in this projection may be kept free of contact between the optical element body 109.1 and the electrode carrier unit 111 and the second electrodes 109.4, respectively. Hence, the introduction of parasitic or residual stress into this sensitive area of the optical element 106.3 is beneficially avoided.

The gap 112 may have any suitable dimension, which reliably prevents contact between the optical element body 109.1 and the electrode carrier unit 111 or the second electrodes 109.4 under any normal operating conditions of the optical imaging arrangement 101, while at the same time keeping the weakening of the electrical field EF across the gap 112 at an acceptable minimum (to keep the electrical power consumption for a given deformation of the optical element 106.3 as low as possible).

The gap 112, at any location of the optical element body rear surface 109.9 in the vicinity of the second electrodes, defines a local gap width LGW along a local surface normal of the optical element body rear surface 109.9. Preferably, the local gap width LGW, at least in the neutral state, in the vicinity of the at least one second electrode, is at least 1 µm, preferably at least 5 µm, more preferably at least 10 µm. This typically reliably prevents contact between the optical element body 109.1 and the electrode carrier unit 111 or the second electrodes 109.4 under any normal operating conditions of the optical imaging arrangement. Moreover, preferably, the local gap width LGW, at least in the neutral state, in the vicinity of the second electrodes 109.4 is at most 100 µm, preferably at most 50 µm, more preferably at most 20 µm. This typically keeps the weakening of the electrical field EF across the gap 112 at an acceptable value.

Particularly beneficial results are achieved at a local gap width LGW of the gap 112 ranging from 5 µm to 20 µm, typically at a local gap width LGW of 10 µm. This provides a good compromise between the losses in the electric field across the gap 112 and ease of manufacture and assembly of the apparatus 101.

The gap 112 itself may have any desired and suitable shape. In particular, the shape of the gap 112 and the resulting dielectric properties of the gap 112 may be used to tune the performance of the piezoelectric device 109, more precisely, the volumetric shape of the electrical fields EF generated between the first electrode 109.3 and respective second electrode 109.4 to a certain desired volumetric behavior, e.g. as a function of a specific deformation of the optical element 106.3 to be achieved.

In the present example, the shape of the front side 111.1 of the electrode carrier unit 111 is adapted to the shape of the optical element body rear surface 109.9, such that the local gap width LGW, at least in the neutral state, in the vicinity of the second electrodes 109.4, is substantially uniform. In these cases, the electrical field EF between the first electrode 109.3 and the respective second electrode 109.4 can be kept uniform. Hence, the piezoelectric device 109 typically exhibits the same response to a given voltage or electrical field, respectively, over its entire (useful) area and the optical footprint of the optical surface 110, respectively.

In the present example, the gap 112, at least temporarily during normal operation of the optical imaging apparatus 101, is filled with a fluid 113. This allows tuning the properties of the gap 112 to a specific desired behavior.

In the present example, the piezoelectric device 109 is further configured to apply, during normal operation of the optical imaging arrangement 101, a maximum voltage VMAX between the first electrode 109.3 and the respective second electrode 109.4. The fluid 113 has a fluid dielectric constant FDC, which is sufficient to prevent arcing of the gap 112 upon appliance of the maximum voltage VMAX between the first electrode 109.3 and the respective second electrode 109.4. This ensures proper operation of the piezoelectric device 109 under any normal operating condition.

It will be appreciated that any desired any suitable fluid may be used. With certain embodiments, the fluid includes at least one gas of a gas group consisting of dry air, dry nitrogen ($N_2$) and sulfur hexafluoride ($SF_6$). As an alternative the fluid may also include at least one liquid of a liquid group consisting of perfluoropolyether (PFPE), glycerin, glycerol ($C_3H_8O_3$), and deionized water ($H_2O$).

Such a fluid, in particular, such a liquid, has the additional advantage that it may provide a damping functionality damping vibrations introduced into the optical element 106.3 and, hence, improving the vibrational behavior of the optical element 106.3.

Furthermore, the fluid 113 may act in a beneficial way as a heat carrier providing improved heat removal from the optical element body to the mechanically decoupled electrode carrier 111, which may then, for example, be part of a temperature control device 116 of the optical imaging arrangement 101.

The fluid 113 may also be used as a parameter in tuning the dielectric properties of the gap 112 in the manner as it has been outlined above. In the present example, the fluid has a fluid dielectric constant FDC and the piezoelectric section formed by the optical element body 109.1 has a piezoelectric section dielectric constant PSDC. The fluid dielectric constant FDC deviates from the piezoelectric section dielectric constant PSDC by at most 30%, preferably by at most 5% to 20%, more preferably by at most 1% to 10%, of the piezoelectric section dielectric constant PSDC. This yields particularly simple configurations.

Figure 2:
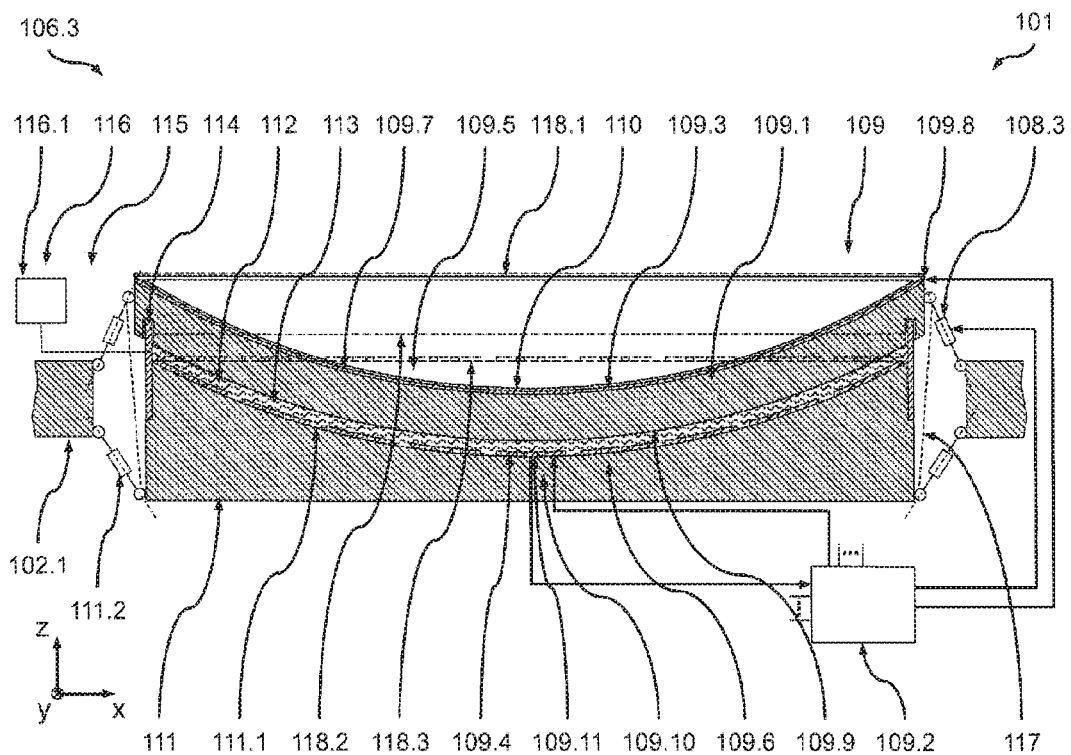
FIG. 2 is a schematic sectional representation of a part of the optical imaging arrangement of FIG. 1.

As can be seen from FIG. 2, in the present example, the piezoelectric device 109 includes a sealing device 114, which acts between the electrode carrier unit 111 and the optical element body 109.1 to seal the gap 112 from a surrounding atmosphere. This is particularly beneficial in applications where the optical imaging arrangement 101 is sensitive to contamination by the fluid 113. In the present example, the sealing device 114 includes a labyrinth seal arrangement, which maintains mechanical decoupling between the electrode carrier unit 111 and the optical element body 109.1 in a beneficial way.

The fluid 113 may be introduced into the gap 112 at any desired time before use of the optical imaging apparatus 101. It may eventually only be exchanged during maintenance of the optical imaging apparatus 101. With certain embodiments, the piezoelectric device 109 may include a purging device 116.1 connected to the electrode carrier unit 111 and configured to purge the gap 112 with a purging fluid forming the fluid 113. This purging device 116.1 may then, for example, also be part of the temperature control device 116 of the optical imaging arrangement.

The electrode carrier unit 111 may be made of any suitable and long term dimensionally stable (at the desired accuracy, typically at micrometer level) material providing proper support and, preferably, electrical separation of the supported second electrodes 109.4. Preferably, the electrode carrier unit 111 is made of a carrier unit material including an electric insulator material, which yields particularly simple configurations.

With certain embodiments, the electrode carrier unit 111 is made of a carrier unit material of a carrier unit material group consisting of a ceramic material, aluminum oxide ($Al_2O_3$), aluminum nitride (AlN), zirconium oxide ($ZrO_2$) and glass porcelain. Such materials typically provide at least some of the beneficial properties as outlined above. In the present example, aluminum oxide ($Al_2O_3$) is selected as the carrier unit material, since it provides all these beneficial properties.

The second electrodes 109.4 are made from at least one layer of electrically conductive material deposited on the electrode carrier unit 111. The second electrodes 109.4 may be formed in any desired pattern in a printed circuit board manufacturing process in ceramics (e.g. by vacuum and electrolytic deposition of copper, followed by photo exposure and subsequent selective etching and resist stripping). This yields particularly simple and inexpensive configurations.

Mechanical decoupling between the optical element body 109.1 and the electrode carrier unit 111 is achieved in that the optical element body 109.1 is supported on the support structure 102.1 via the optical element body support unit 108.3, while the electrode carrier unit 111 is supported on the support structure 102.1 (in a kinematically parallel manner to the optical element body 109.1) via an electrode carrier support unit 111.2 separate from the optical element body support unit 108.3.

As indicated by the dashed contours 117 in FIG. 2, as an alternative, a kinematically serial support arrangement may be selected. Here, the optical element body support unit 108.3 contacts the optical element body 109.1 at optical element body support locations and the electrode carrier support unit 117 contacts the optical element body 109.1 in a vicinity of each of the optical element body support locations. Such a cascaded support with an introduction of the support forces for the electrode carrier unit 111 into the optical element body 109.1 at locations close to the introduction of the support forces for the optical element body 109.1 minimizes the path length of the support forces for the electrode carrier unit 111 flowing through the optical element body 109.1 and, hence, the corresponding resulting disturbance introduced into the optical element body 109.1.

It will be appreciated that the present concept, not least due to the elimination of long term variations of the interaction between the piezoelectric device 109 and the optical element 106.3, where desired, allows implementation of an open loop control of the piezoelectric device 109 via the control unit 109.2. With other embodiments, however, a closed loop control may be implemented as well via the control unit 109.2.

It will be appreciated that, as outlined above, the piezoelectric device 109 may be used as a deformation device introducing a certain desired deformation into the optical element 106.3. In addition or as an alternative, the piezoelectric device may also be used as a sensor device using the first electrode 109.3 and the respective second electrodes 109.4.

In the present example, the piezoelectric device 109 however includes a sensor device 109.10 configured to provide sensor information SI to the control unit 109.2, the sensor information SI being representative of a deformation and/or an orientation and/or a position of the optical element body 109.1 and/or a vibrational disturbance acting on the optical element body 109.1 in at least one degree of freedom (DOF) up to all six degrees of freedom in space.

Here, the sensor device 109.10 also works according to a piezoelectric working principle. To this end, the sensor device 109.10 includes a plurality of third electrodes 109.11, each separately connected to the control unit 109.2. Each third electrode 109.11 is associated to a second electrode 109.4 and electrically insulated as well as sufficiently spaced (typically from 2 mm to 10 mm) from the second electrode 109.4 to prevent cross-talk or arcing. The control unit 109.2 may capture the sensor information, since any deformation of the optical element body 109.1 as well as any alteration in the position between the first electrode 109.3 and the respective third electrode 109.11 also creates an alteration in the voltage between these electrodes 109.3 and 109.11, which is representative of the sensor information SI.

The third electrode 109.12 may be arranged in any desired and suitable way as a function of the sensor information to be obtained. As can be seen from FIGS. 2 and 3, each third electrode 109.11 is surrounded by the associated second electrode 109.4 and located at an area center of gravity of the second electrode 109.4. This provides a functional association of the respective third electrode to the specific second electrode 109.4, which is beneficial, in particular, with respect to the accuracy of a closed loop control provided via the control unit 109.2.

Typically, the third electrode 109.11 is much smaller than the associated second electrode 109.4. The surface of the third electrode 109.11 is typically 1% to 20%, preferably 2% to 15%, more preferably 2% to 10%, of the surface of the second electrode 109.4.

Preferably, the control device 109.2 is configured to apply a voltage between the first electrode 109.3 and the respective second electrode 109.4 as a function of the sensor information SI. This closed loop control may be used for any desired purpose. In particular, it may be used to influence a vibrational behavior of the optical element body 109.1, in particular, to increase a resonant frequency of the optical element body 109.1.

Figure 3:
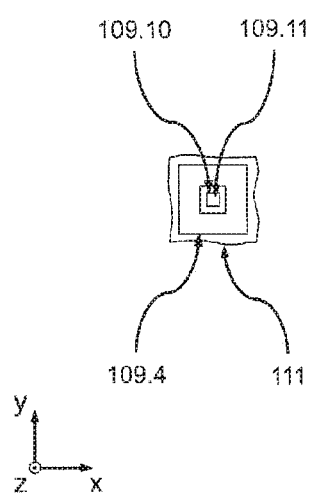
FIG. 3 is a schematic top view of a part of the optical imaging arrangement of FIG. 2.
Figure 4:
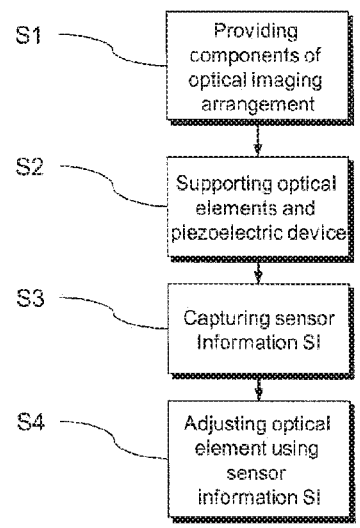
FIG. 4 is a block diagram of a preferred embodiment of an optical imaging method according to the disclosure including preferred embodiments of the further methods according to the disclosure which may be executed with the optical imaging arrangement of FIG. 1.

In the foregoing, the disclosure has been described in the context of an embodiment, where the optical element 106.3 including the piezoelectric device 109 was part of the optical projection unit 102. It will be appreciated however, that such an optical element including the piezoelectric device 109 (as shown in FIGS. 2 and 3), in addition or as an alternative, may also form part of the illumination unit 105.

A typical dimension of such a mirror 106.3 can be around 300 mm×100 mm×10 mm. For an applied voltage of 3 kV between the first electrode 109.3 and the respective second electrode 109.4, the deformation in such an example amounts to approximately 120 nm.

As the optical element body 109.1 is made wholly of lithium niobate ($LiNbO_3$) and has no counter element to push against, the deformation will appear symmetrically on both sides of the optical element body 109.1, i.e. only half of the deformation will appear on the mirror optical surface 110. However, since lithium niobate ($LiNbO_3$) is bipolar, by driving adjacent second electrodes 109.4 with positive and negative polarities (i.e. applying up to +/−3 kV to different zones of the optical element body 109.1, a total optical surface deformation of 120 nm peak to valley can still be achieved.

In the present example, the optical surface 110 is a spherical surface with a defined radius of curvature. It will be appreciated however that, with other embodiments, the optical surface 110 may have any other shape, such as e.g. an aspherical shape (not shown) or a planar shape (as indicated by the dashed contour 118.1 in FIG. 2). In the latter case, the optical element body may then be a simple plane parallel plate as it is indicated by the contour 118.2. The electrode carrier unit may then form a planar carrier surface 118.3 carrying the (then also planar) second and third electrodes 109.4, 109.11. Hence, again, a gap 112 of substantially uniform width is formed. Such planar deformable mirrors may, for example, be used in catadioptric projection systems, e.g. operating in the VUV range (e.g. at 157 nm or at 193 nm), such as they are known, for example, from WO 2005/069055 A2 (Shafer et al.), the entire disclosure of which is incorporated herein by reference.

With the optical imaging apparatus 101 of FIGS. 1 to 3 a method of transferring an image of a pattern onto a substrate may be executed using a preferred embodiment of the method of supporting components of a piezoelectric device according to the disclosure, a preferred embodiment of the method of capturing information representative of a deformation and/or an orientation and/or a position of the optical element body and a preferred embodiment of the method of actively adjusting the optical element body as it will be described in the following with reference to FIGS. 1 to 4.

In a transferring step of this method, an image of the pattern formed on the mask 103.1 is transferred onto the substrate 104.1 using the optical projection unit 102 of the optical imaging arrangement 101, which have been provided in a step S1 in the configuration as outlined above, wherein the components of the piezoelectric device 109 have been supported in the configuration as outlined above in a step S2.

To this end, in a capturing step S3 of the transferring step, the sensor information SI is captured using a method of capturing the sensor information SI as it has been outlined above. During this capturing step S3 the optical element 106.3 and the components of the piezoelectric device 109 are supported using a method according to the disclosure as it has also been outlined above.

In a controlling step S4 of the transferring step, the control device 109.2 controls the piezoelectric device 109 and, eventually also the support device 108.3 of the optical element 106.3 as a function of sensor information SI as it has been outlined above. In an exposure step, immediately following or eventually overlapping the controlling step S4, the image of the pattern formed on the mask 103.1 is then exposed onto the substrate 104.1 using the optical imaging arrangement 101.

Although, in the foregoing, embodiments of the disclosure have been described where there is only one single front side first electrode 109.3, it will be appreciated that, eventually, a plurality of separated front side first electrodes 109.3 may be provide.

Furthermore, although in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units.

Furthermore, it will be appreciated that the present disclosure, although mainly described in the context of microlithography in the foregoing, may also be used in the context of any other type of optical imaging process, typically involving a comparably high level of imaging accuracy. In particular, the disclosure may be used in the context of any other type of optical imaging process operating at different wavelengths, in particular, in imaging process operating at wavelengths in a so called Vacuum Ultraviolet (VUV) range (typically from 100 nm to 200 nm, e.g. at 193 nm).

What is claimed is:

1. An arrangement, comprising:
   an optical element which comprises an optical element body having a front side and a rear side opposite the front side, an optical surface being supported by the front side of the optical element body;
   a piezoelectric device comprising a first electrode and a piezoelectric element; and
   a second electrode,
   wherein:

the first electrode is located on the front side of the
optical element body;
the optical surface comprises a reflective layer;
the reflective layer is disposed directly on the first
electrode;
the piezoelectric element defines a piezoelectric section
of the optical element body; and
the first electrode is configured to cooperate with the
piezoelectric element and the second electrode when
the second electrode is located on the rear side of the
optical element body and the piezoelectric element is
located between the first and second electrodes.

2. The arrangement of claim 1, wherein at least one of the following holds:
the first electrode is between the optical surface and the
piezoelectric section;
the first electrode is between the optical surface and the
optical element body;
the first electrode comprises a layer of electrically conductive material on at least one member selected from
the group consisting of the optical element body and
the piezoelectric section; and
at least a part of the optical surface comprises a surface of
the first electrode.

3. The arrangement of claim 1, wherein the piezoelectric section substantially extends from the first electrode to a rear surface of the optical element body confining the optical element body at the rear side of the optical element body.

4. The arrangement of claim 1, wherein the optical surface defines an optically usable area of the optical element usable in an EUV microlithography process, and the piezoelectric section extends over at least the optically usable area.

5. The arrangement of claim 1, wherein at least one of the following holds:
the piezoelectric section defines at least 80% of the optical
element body;
the optical element body comprises a piezoelectric material which defines the piezoelectric section; and
the optical element body is a monolithic body comprising
a piezoelectric material.

6. The arrangement of claim 1, wherein the optical surface defines an optically usable area of the optical element usable in an EUV microlithography process over at least the optically usable area; and a dimension of the optical element body along a local surface normal of the optical surface is substantially uniform.

7. The arrangement of claim 1, wherein the piezoelectric section comprises a material having a piezoelectric coefficient that is at least two times a piezoelectric coefficient of a quartz ($SiO_2$) material.

8. The arrangement of claim 1, wherein at least one of the following holds:
the piezoelectric section comprises a material having a
piezoelectric coefficient that is at least 10 pm/V;
the piezoelectric section comprises a glass like piezoelectric material;
the piezoelectric section comprises a bipolar piezoelectric
material configured to contract in reaction to a first
electric field of a first polarity and to expand in reaction
to a second electric field of a second polarity, the
second polarity being opposite the first polarity;
the piezoelectric section comprises a piezoelectric material suitable for undergoing an optical surface manufacturing process to produce an optical grade surface of
the optical element body for use in an EUV microlithography process;
the piezoelectric section comprises at least one material
selected from a material group consisting of lithium
niobate ($LiNbO_3$), diphenylalanine peptide nanotubes
(PNTs), quartz ($SiO_2$), gallium phosphate ($GaPO_4$),
hemimorphic tourmaline, lanthanum gallium silicate
($La_3Ga_5SiO_{14}$), and calcium gallo-germanate
($Ca_3Ga_2Ge_4O_{14}$); and
the piezoelectric section comprises an anisotropic piezoelectric material having a direction of maximum
response to an electrical field, the material of the
piezoelectric section being configured so that an inclination between a direction of maximum response and a
local surface normal of the optical surface is less than
20°.

9. The arrangement of claim 1, further comprising an electrode carrier unit separate from the optical element body, wherein the second electrode is on the electrode carrier unit.

10. The arrangement of claim 9, wherein:
the piezoelectric device comprises the electrode carrier
unit; and
the electrode carrier unit is located adjacent to a rear
surface of the optical element body confining the rear
side of the optical element body.

11. The arrangement of claim 10, wherein, in a neutral state of the arrangement, a gap is present between the electrode carrier unit and the optical element body rear surface so that, in a vicinity of the second electrode, the optical element body rear surface does not contact the electrode carrier unit or the second electrode.

12. The arrangement of claim 11, wherein:
the gap defines a local gap width along a local surface
normal of the optical element body rear surface at any
location of the optical element body rear surface in the
vicinity of the second electrode; and
at least one of the following holds:
in the neutral state, the local gap width in the vicinity
of the second electrode is at least 1 μm;
in the neutral state, the local gap width in the vicinity
of the second electrode is at most 100 μm; and
a shape of the electrode carrier unit is configured to a
shape of the optical element body rear surface so
that, in the neutral state, the local gap width in the
vicinity of the second electrode is at least substantially uniform.

13. The arrangement of claim 11, wherein the gap is at least temporarily filled with a fluid during normal operation of the arrangement.

14. The arrangement of claim 13, wherein at least one of the following holds:
the piezoelectric device is configured to apply, during
normal operation of the arrangement, a maximum
voltage between the first and second electrodes, and the
fluid has a fluid dielectric constant sufficient to prevent
arcing of the gap upon appliance of the maximum
voltage between the first and second electrodes;
the fluid comprises at least one gas selected from the
group consisting of dry air, dry nitrogen ($N_2$) and sulfur
hexafluoride ($SF_6$);
the fluid comprises at least one liquid selected from the
group consisting perfluoropolyether (PFPE), glycerin,
glycerol ($C_3H_8O_3$) and deionized water ($H_2O$); and
the fluid has a fluid dielectric constant and the piezoelectric section has a piezoelectric section dielectric constant, the fluid dielectric constant deviating from the
piezoelectric section dielectric constant by at most 30%
of the piezoelectric section dielectric constant.

15. The arrangement of claim 11, wherein at least one of the following holds:
   the piezoelectric device comprises a sealing device configured to act between the electrode carrier unit and the optical element body and to seal the gap from a surrounding atmosphere; and
   the piezoelectric device comprises a purging device configured to purge the gap with a purging fluid.

16. The arrangement of claim 9, wherein at least one of the following holds:
   the electrode carrier unit comprises an electric insulator material;
   the electrode carrier unit comprises a material selected from the group consisting of a ceramic material, aluminum oxide ($Al_2O_3$), aluminum nitride (AlN), zirconium oxide ($ZrO_2$) and glass porcelain;
   the second electrode comprises a layer of electrically conductive material deposited on the electrode carrier unit; and
   the second electrode is formed in a printed circuit board manufacturing process.

17. The arrangement of claim 9, wherein the optical element body is supported on a support structure via an optical element body support unit and the electrode carrier unit is supported on the support structure via an electrode carrier support unit in such a manner that at least a vicinity of the at least one second electrode is mechanically decoupled from the optical element body.

18. The arrangement of claim 17, wherein at least one of the following holds:
   the optical element body support unit is separate from the electrode carrier support unit;
   the optical element body support unit contacts the optical element body at at least one optical element body support location, and the electrode carrier support unit contacts the optical element body in a vicinity of the at least one optical element body support location; and
   the electrode carrier support unit contacts the optical element body at at least one electrode carrier support location, and the optical element body support unit contacts the electrode carrier unit in a vicinity of the at least one electrode carrier support location.

19. The arrangement of claim 1, wherein:
   the piezoelectric device comprises a sensor device configured to provide sensor information to a control device;
   the sensor information is representative, in at least one degree of freedom in space, of at least one parameter selected from the group consisting of a deformation of the optical element body, an orientation of the optical element body, a position of the optical element body, and a vibrational disturbance acting on the optical element body; and
   at least one of the following holds:
      the sensor device comprises a third electrode electrically insulated from the second electrode and located in a vicinity of the second electrode, the third electrode being surrounded by the second electrode, and a surface of the third electrode being from 1% to 20% of a surface of the second electrode;
      the sensor device comprises a third electrode electrically insulated from the second electrode and located in a vicinity of the second electrode, the third electrode being located at an area center of gravity of the second electrode, and a surface of the third electrode being from 1% to 20% of a surface of the second electrode; and
      the piezoelectric device comprises the control device, the control device being configured to apply a voltage between the first and second electrodes based on the sensor information to influence a vibrational behavior of the optical element body.

20. The arrangement of claim 1, wherein at least one of the following holds:
   the arrangement is configured to be used in EUV microlithography using exposure light at an exposure light wavelength in an EUV or a VUV range;
   the exposure light has an exposure light wavelength ranging from 5 nm to 20 nm or from 100 nm to 200 nm; and
   the arrangement further comprises an illumination unit, a mask unit, an optical projection unit and a substrate unit, the illumination unit being configured to illuminate a mask received by the mask unit with the exposure light, the optical projection unit being configured to transfer an image of a pattern formed on the mask onto a substrate received by the substrate unit, and the optical element defining part of the illumination unit or the optical projection unit.

21. A method, comprising:
   providing the arrangement of claim 1; and
   using the piezoelectric device to capture information representative of at least one member selected from the group consisting of a deformation of the optical element body in at least one degree of freedom in space, an orientation of the optical element body in at least one degree of freedom in space, and a position of the optical element body in at least one degree of freedom in space.

22. A method, comprising:
   providing the arrangement of claim 1; and
   using the piezoelectric device to actively adjust at least one member selected from the group consisting of a deformation of the optical element body in at least one degree of freedom in space, an orientation of the optical element body in at least one degree of freedom in space, and a position of the optical element body in at least one degree of freedom in space.

23. A method, comprising:
   using the arrangement of claim 1 in an exposure process using exposure light to transfer an image of a pattern onto a substrate.

24. The method of claim 23, wherein the method further comprises at least one of the following:
   during the exposure process, using the piezoelectric device to capture information representative of at least one member selected from the group consisting of a deformation of the optical element body in at least one degree of freedom in space, an orientation of the optical element body in at least one degree of freedom in space, and a position of the optical element body in at least one degree of freedom in space; and
   during the exposure process, using the piezoelectric device to actively adjust at least one member selected from the group consisting of a deformation of the optical element body in at least one degree of freedom in space, an orientation of the optical element body in at least one degree of freedom in space, and a position of the optical element body in at least one degree of freedom in space.

25. A method of supporting a first electrode, a second electrode and a piezoelectric element of a piezoelectric device of an arrangement, which comprises an optical element comprising an optical element body carrying an optical surface on a front side of the optical element body, the method comprising:

locating the second electrode on a rear side of the optical element body, the rear side of the optical element body being opposite the front side of the optical element body;

locating the piezoelectric element between the first and second electrodes;

locating the first electrode on the front side of the optical element body; and forming the at least one piezoelectric element by at least one piezoelectric section of the optical element body, wherein the optical surface comprises a reflective layer, and the reflective layer is disposed directly on the first electrode.

26. The method of claim 25, wherein at least one of the following holds:

the first electrode is between the optical surface and the at least one piezoelectric section;

the first electrode is between the optical surface and the optical element body;

the first electrode comprises a layer of electrically conductive material on at least one member selected from the group consisting of the optical element body and the at least one piezoelectric section; and at least a part of the optical surface comprises a surface of the first electrode.

27. The method of claim 25, wherein the second electrode is on an electrode carrier unit, which is located adjacent to an optical element body rear surface confining the optical element body at the rear side.

28. The method of claim 27, wherein at least one of the following holds:

in a neutral state of the arrangement, a gap is present between the electrode carrier unit and the optical element body rear surface so that, at least in a vicinity of the second electrode, the optical element body rear surface does not contact the electrode carrier unit or the second electrode, and the gap is at least temporarily filled with fluid during normal operation of the arrangement; and the optical element body is supported on a support structure via an optical element body support unit, and the electrode carrier unit is supported on the support structure via an electrode carrier support unit so that at least a vicinity of the second electrode is mechanically decoupled from the optical element body.

* * * * *

UNITED STATES PATENT AND TRADEMARK OFFICE
CERTIFICATE OF CORRECTION

PATENT NO. : 11,656,453 B2
APPLICATION NO. : 16/983172
DATED : May 23, 2023
INVENTOR(S) : Yim-Bun Patrick Kwan, Axel Lorenz and Jasper Wesselingh It is certified that error appears in the above-identified patent and that said Letters Patent is hereby corrected as shown below:

In the Specification

Column 7, Line 9, delete "($La_3Ga_2SiO_{14}$," insert -- ($La_3Ga_5SiO_{14}$, --.

Signed and Sealed this
Eleventh Day of July, 2023

Katherine Kelly Vidal
*Director of the United States Patent and Trademark Office*